(12) United States Patent
Bosshart

(10) Patent No.: US 6,327,218 B1
(45) Date of Patent: Dec. 4, 2001

(54) INTEGRATED CIRCUIT TIME DELAY MEASUREMENT APPARATUS

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/788,806

(22) Filed: Feb. 20, 2001

Related U.S. Application Data
(60) Provisional application No. 60/187,419, filed on Mar. 7, 2000.

(51) Int. Cl.[7] .................................................. G11C 8/00
(52) U.S. Cl. ..................... 365/233; 365/194; 365/189.07
(58) Field of Search .................................. 365/233, 194, 365/189.07, 201, 189.05; 327/158

(56) References Cited

U.S. PATENT DOCUMENTS

| | | | |
|---|---|---|---|
| 5,386,392 | 1/1995 | Cantiant et al. ...................... | 365/233 |
| 5,440,274 | 8/1995 | Bayer .................................. | 331/1 A |
| 5,506,874 | 4/1996 | Izzard et al. ......................... | 375/340 |
| 5,550,783 | * 8/1996 | Stephens et al. .................... | 365/233 |
| 6,011,748 | 1/2000 | Lepejian et al. ..................... | 365/233 |

* cited by examiner

*Primary Examiner*—Trong Phan
*Assistant Examiner*—David Lam
(74) *Attorney, Agent, or Firm*—April M. Mosby; W. James Brady; Frederick J. Telecky, Jr.

(57) ABSTRACT

A circuit (100) for measuring circuit time delay of an integrated circuit herein provides the ability to accurately measure access time of a memory device (202) without requiring a high performance expensive tester. The apparatus (100) includes a phase detector (108) having a first and a second input (CLK1, CLK2). Both the first input (CLK1) of the phase detector (108) and the input of the memory device (202) are coupled to receive a clocking signal, having a period, T. The second input (CLK1) of the phase detector (108) is coupled to the output of the memory device (202). The two outputs (UP, DOWN) of the phase detector (108) couple to a first and a second filter (110, 114, 112, 116). A comparator is coupled to receive the two filtered outputs for sensing the difference, $V_{Diff}$, between the two signals. A processing unit is connected to the comparator to calculate the access time, where access time= $(V_{Diff}/V_{DD})$ T and $V_{DD}$ is the power supply rail voltage. The breadth of memory design support for this circuit is unique which includes test measurement capabilities for embedded SRAM, ROM and DRAM type memories.

8 Claims, 2 Drawing Sheets

INTEGRATED CIRCUIT TIME DELAY MEASUREMENT APPARATUS

This application claims benefit of Provisional Application 60/187,419 filed Mar. 7, 2000.

FIELD OF THE INVENTION

The present invention relates to semiconductor integrated circuits and, more particularly, to test circuits built into the integrated circuits (ICs) that enable efficient testing of embedded memory.

BACKGROUND OF THE INVENTION

Testing and measuring certain parametrics electronic products is a crucial part of the manufacturing process. This is particularly the case with today's complex products, in which even the smallest hardware defect can cause serious malfunctions. Integrated circuits are widely used because they offer a high functionality per unit of cost. Today's system-on-silicon and core-based design styles drive the integration of logic and memory within a single device. An increasing percentage of the silicon area in a complex IC is embedded memory. To achieve the economies necessary in modern integrated circuit manufacturing, it is necessary to minimize both the cost of the raw circuit as well as the cost of testing and measuring certain parametrics. However, testing of the embedded memories within these complex ICs is increasingly difficult. Adding test access to the embedded memories increases design size and complexity and in some cases increases cost. As products, however, become more complex, it becomes difficult to use traditional external testing methods. This is the case because the integrated-circuit are operating at increasing frequencies. In addition, testing equipment has bandwidth and performance limitations.

Circuit time delay is the amount of time necessary to process input information and make it available for further processing at the output of the circuit. The circuit time delay measure provides the information necessary for integration with other circuits. More particularly, access time is the time that a memory device, such as dynamic random access memory (DRAM) and static RAM (SRAM), takes to locate a single piece of information and make it available to the computer for processing. Access time for a DRAM ranges from 50 to 150 nanoseconds. While the access time for the SRAM can be as low as 600 picoseconds. Access time is the primary measurement used to sort devices because it is the best indicator of the die process parameters. It is an absolute requirement that an accurate measurement of the memory access time be obtained, particularly, in view of the continuous trend towards decreasing the system cycle time coupled to the design of high speed SRAM macros having themselves a reduced memory access time.

Built-In Self Test (BIST), which moves critical test and measurement functions inside chips, are commonly used to measure access time. BIST uses scanning technology to provide the stimulus-generation and response-processing capabilities necessary to test and measure parametrics for complex logic structures and embedded memory. An example of access time measurement using Array Built-In Self Test (ABIST) is described in U.S. Pat. No. 5,386,392 entitled "Programmable High Speed Array Clock Generator Circuit for Array Built-In Self Test Memory Chips" which is incorporated by reference herein.

Herein a clock distribution scheme is considered, yet, it is difficult if not impossible to test the memory of the SRAM macro having such short system cycle time and make accurate memory access time measurements because of the unacceptable imprecision caused by uncontrollable clock signal skews. This is particularly true in the ABIST manufacturing sub-mode where the imprecision inherent to the clock distribution scheme originates from a variety of factors such as: tester limitations, width variations of the clock signals generated by the tester, off-chip line delays caused by the lines between the tester and the chip, chip internal clock distribution networks, etc. In addition, calibration of the clock signals generated by the tester is required for state of the art SRAM macros. This calibration is process dependent and thus must be done for each chip lot. The calibration is achieved by estimating the internal delays after accurate kerf measurements. As a result, it is expensive and time consuming to perform an accurate memory access time measurement in an ABIST manufacturing sub-mode because it requires high performance and expensive testers. However, this skew also exists in the ABIST system sub-mode. It is caused by the chip internal clock distribution network and by mismatches in the internal chip path delay thereof. For each clock signal, the mismatch results from physical wiring layout imbalances and device differences between the driver circuits that buffer the clock signals, which in turn results in layout and process dependency.

A preferred embodiment of the ACG circuit optimized for the ABIST manufacturing sub-mode of the reference cited includes two delay lines having, two 2-way AND gates, and three inverters. It further includes a 2-way AND gate. The clock signal is applied to the input terminal which is connected to a first input of AND gate and first inverter. The output of first inverter is connected to the input of first delay line, whose output is connected to the second input of first AND gate and to the first input of a second AND gate via a second inverter and a second delay line. The clock signal is applied to the second input of a second AND gate by a connection or optionally via a third delay line. The ungated clock signal available at the output of the first AND block is gated at third AND gate by gating signal generated by the ABIST unit when the clock signal CACG at a first output terminal is inhibited. The CSACG signal is available through the third inverter at a second output terminal. The BACG and the SACG signals are generated by the second AND gate and are available at a common third output terminal.

This embodiment is optimized for the ABIST manufacturing sub-mode when the macros are individually tested on a serial basis by the external tester which can precisely control the width of the clock signal, and which is the same for all the macros within the chip. Circuit thus allows an accurate memory access time measurement simply by varying the clock signal pulse width when the chip is tested during the ABIST manufacturing sub-mode, and it is thus easy to determine its operating limits. However, whereas a precise control of the pulse width is relatively simple in a manufacturing environment thanks to the tester, it becomes quite difficult in the system environment.

Another possible approach to measuring access time in embedded memories is to connect the control, address, and data lines of the memories to external pads of the integrated circuit. Multiplexer blocks are implemented within the integrated circuit to connect the embedded memories either to the external pads for testing or to internal buses for standard circuit operation. A drawback to this approach is that the extra bus lines and pads increase the size of the semiconductor die and the extra pads increase the number of pins required of the tester. The cost of the tester is generally roughly proportional to the number of pins. Since the trend is toward wide memories of increasingly large capacity in modern ICs, the number of extra buses and pads required can frequently exceed one-hundred, which represents a prohibitive cost burden. In addition, the delay from the bondpad driver is typically larger than the delay of the SRAM.

Another approach includes storing the outputs of an SRAM in a register. Problems arise, however, when the clock frequency increases simultaneous to the timing edge for the register. As a result, the clock period is shortened which is available to sample the data. Varying the frequency of the register while recording samples mingles the timing information from the memory and device logic where the information is not separable or distinguishable.

There is a need for an built-in circuit delay measurement apparatus that may be used in a variety of applications, including memory devices, such as SRAM and a DRAM.

SUMMARY OF THE INVENTION

A circuit for measuring circuit time delay of an integrated circuit herein provides the ability to accurately measure access time of a memory device without requiring a high performance expensive tester. The apparatus includes a phase detector having a first and a second input. Both the first input of the phase detector and the input of the memory device are coupled to receive a clocking signal, having a period, T. The second input of the phase detector is coupled to the output of the memory device. The two outputs of the phase detector couple to a first and a second filter. A comparator is coupled to receive the two filtered outputs for sensing the difference, $V_{Diff}$, between the two signals. A processing unit is connected to the comparator to calculate the access time, where access time= $(V_{Diff}/V_{DD})$ T and $V_{DD}$ is the power supply rail voltage.

The breadth of memory design support is unique which includes testing capabilities for embedded SRAM, ROM and DRAM type memories. The addition of this circuit to electronics hardware frequently does not significantly increase a product's size, cost, and production time. Furthermore, this measurement apparatus permanently resides on the chip throughout its life, adding future cost savings.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE PREFERRED EMBODIMENTS

Figure 1:
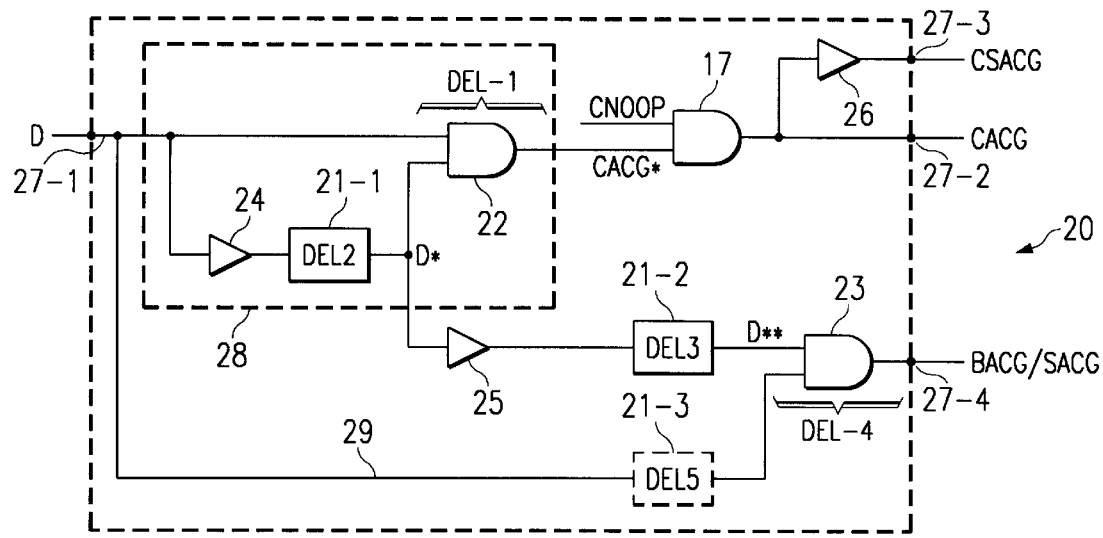
FIG. 1 known memory access time measuring apparatus.

The present invention is best understood by comparison with the prior art. Hence, this detailed description begins with a discussion of known built-in SRAM access time measurement apparatus shown in FIG. 1 as disclosed in U.S. Pat. No. 5,386,392 entitled "Programmable High Speed Array Clock Generator Circuit for Array Built-In Self Test Memory Chips". An array clock generator (ACG) circuit 20 uses both edges of an input clock signal labeled D which is generated by a tester in a sub-mode. Circuit 20 includes two delay lines 21-1 and 21-2 having, respectively, delays labeled DEL2 and DEL3, three 2-way AND gates 17, 22 and 23, and three inverters 24 to 26. Both input and output terminals are generically referenced 27. The D clock signal is applied to the input terminal 27-1 which is connected to one input of AND gate 22 and inverter 24. The output of inverter 24 is connected to the input of delay line 21-1, whose output is connected to the second input of AND gate 22 and to the first input of AND gate 23 via inverter 25 and delay line 21-2. The signals at the output of delay lines 21-1 and 21-2 are respectively labeled D* and D**. The combination of AND gate 22, inverter 24 and delay line 21-1 result in a conventional signal chopper circuit 28. The delays inherent to AND gates 22 and 23 are respectively referred to as DEL1 and DEL4. The D clock signal is applied to the second input of AND gate 23 by connection 29 or optionally via a delay line 21-3 that introduces a delay DEL5. To facilitate the memory access time measurement, it is recommended that DEL1=DEL4 (or DEL1=DEL4+DEL5, if the option mentioned above is implemented). The ungated clock signal CACG* available at the output of AND block 22 is gated at AND gate 16 by gating no operation signal generated by the ABIST unit 11 when the clock signal CACG at output terminal 27-2 is inhibited.

In operation, circuit 20 provides two clock edges with a precise time delay between them generated by varying frequency or using two clocks separated by a precise delay. The first edge starts the SRAM and the second edge samples the data. Measurement of access time is calculated by varying the pulse width of the incoming clock signal. The clock signal pulse is fixed by the sum of these internal delays DEL1–5. This, however, is not a very practical scheme for memories that run as fast as they do today in the Gigahertz range. This would require lower than a half nanosecond pulse width to measure the access time. This pulse width is not easily generated. Another disadvantage of circuit 20 exists because the clock generator and the SRAM must be controlled by additional control circuitry. In addition, delays DEL1–5 are relative to process variations. Thus, any process variations in circuit 20 are subtracted from the memory access time measurement. Moreover, a calibration step is taught whereby each delay is calibrated. The delay, however, may vary from integrated circuit to integrated circuit. The teaching of an interpolative method of searching for the correct delay time is not efficient. Thus, a more direct approach is needed.

Figure 2:
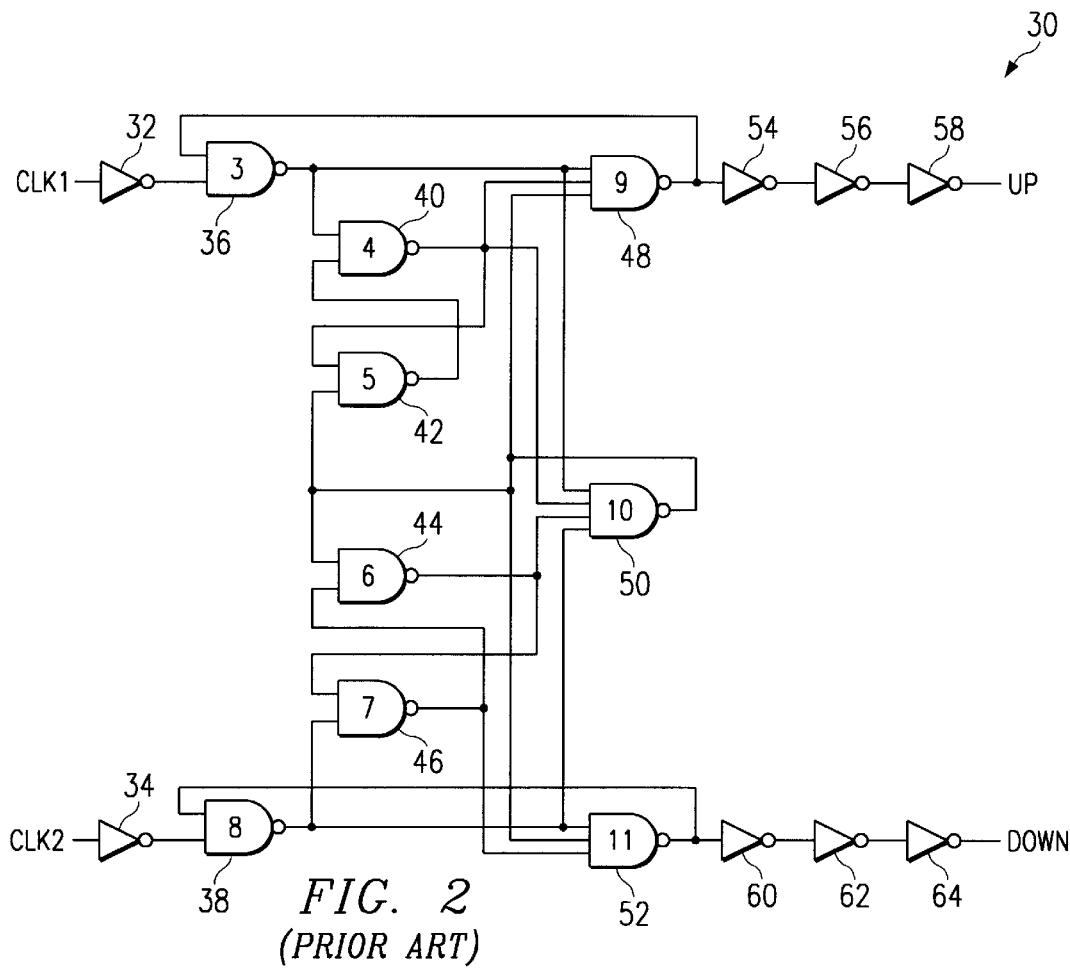
FIG. 2 known phase detector.

FIG. 2 displays a known phase detector. A clock signal $Clk_1$ is received by inverter 32 which is coupled to a first input of NAND gate 36. A second clock signal $Clk_2$ is received by inverter 34 which is coupled to a first input of a second NAND gate 38. The output of NAND gate 36 couple to the first input of NAND gates 40, 48 and 50. The output of NAND gate 40 is coupled to the second input of NAND gates 42, 50 and 48. The output of NAND gate 48 couples to the second input of NAND gate 36 and inverter 54. The output of NAND gate 42 is coupled to the second input of NAND gate 40. The output of NAND gate 38 couple to the first input of NAND gates 46 and 52 and third input of NAND gate 50. The output of NAND gate 44 couples to the second input of NAND gate 46 and fourth input of NAND gate 50. The output of NAND gate 46 couples to the second input of NAND gate 44 and the second input of NAND gate 52. The output of NAND gate 52 couples to the second input of NAND gate 38 and inverter 60. The output of NAND gate 50 couples to the first input of NAND gates 42 and 44 and couples to the third inputs of NAND gates 48 and 52. Inverter 54 couples to inverter 56 which couples to inverter 58. Inverter 60 couples to inverter 62 which couples to inverter 64.

In operation, a phase detector samples the rising edge of pulses coming from two samples and measures the delay difference between the two. Accordingly, it produces an output voltage proportional to the phase difference of the two input signals. As shown, phase detector 30 has two outputs, UP and DOWN. If two inputs arrive at the same time, both outputs, UP and DOWN, will display a very narrow pulse. If input signal $Clk_1$ arrives earlier than $Clk_2$, the pulse width of the output UP will be longer than the pulse width of the DOWN output. The difference Δt between the two outputs UP and DOWN is the difference of the phase between both input signals, $Clk_1$ and $Clk_2$. If input signal $Clk_2$ arrives earlier than input signal $Clk_1$, the output DOWN pulse width will be wider than the pulse width of the output UP pulse width. The difference between the two output signals, UP and DOWN, is the difference of the phase between both signals.

Figure 3:
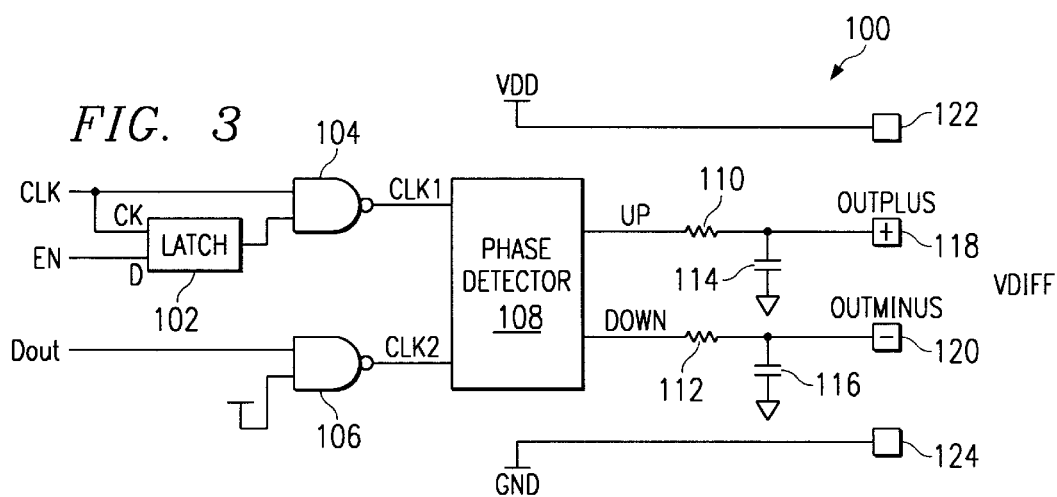
FIG. 3 a built-in circuit delay time measuring apparatus in accordance with the present invention.

FIG. 3 shows a circuit delay time measurement apparatus 100 in accordance with the present invention. A clock signal Clk and enable signal En couple to a latch device 102. The output of the latch device 102 and the clock signal Clk are coupled into NAND gate 104. Output signal $D_{out}$ from the circuit in which the time delay is being measured couples into NAND gate 106. The outputs of NAND gates 104 and 106 are coupled into the first and second inputs of phase detector 108. The outputs, UP and DOWN, of the phase detector 108 couple to resistors 110 and 112. Capacitors 114 and 116 couple between resistors 110 and 112 and ground, respectively. The difference between outputs signals 118 and 120 provide the time delay measurement. As such, a simple voltmeter can be used to measure the delay of an on-chip circuit, even though the circuit is not meant to drive a large load. The delay of the circuit is very small, for example, less than a nanosecond.

In operation, phase detector 108, having two output signals, UP and DOWN, receives two input signals $CLK_1$ and $CLK_2$. Output signal UP maintains a high voltage level, if input signal $CLK_1$ changes level from a high voltage level to a low voltage level or vice versa before signal $CLK_2$ changes level. Output signal DOWN will maintain a high voltage level if input signal $CLK_1$ changes level after signal $CLK_2$ changes level. Note also that in the schematic of FIG. 2, the input inverters 32 and 34 have been replaced by NAND gates 104 and 106 for disablement of input pulses. Both the outputs, UP and DOWN, are sent through RC filters, including resistors 110 and 112 and capacitors 114 and 116, which have a time constant much longer than the clock cycle time of the inputs. The RC filters can be substituted with low pass filters. The RC circuits rise during the time pulse rises and falls when pulse falls. The average value of these pulses is the width divided by the period. The RC filters provide output signals OUTPLUS and OUTMINUS. Cumulative voltage from signals OUTPLUS and OUTMINUS averages the pulses UP and DOWN output from the phase detector 108. The differential voltage $V_{diff}$ between output signals OUTPLUS and OUTMINUS equals $V_{diff}/V_{DD}$=Delay/Period Delay=$(V_{diff}/V_{DD})$*Period where Period represents the clock period and Delay represents the time difference between the arrival of signals $Clk_1$ and $Clk_2$. Therefore, the circuit delay can be easily computed given a simple voltage measurement of the differential voltage $V_{diff}$. A comparator (not shown) may be coupled to receive the two filtered outputs, OUTPLUS and OUTMINUS, for sensing the difference, $V_{Diff}$, between the two signals. A processing unit (not shown) may be connected to the comparator to calculate the access time, where access time=$(V_{Diff}/V_{DD})$ T and $V_{DD}$ is the power supply rail voltage.

Note that $V_{DD}$ and GND are also output signals 122 and 124 to facilitate an accurate reading of the local value of $V_{DD}$ and GND. Resistors 110 and 112 can be implemented on chip using long polysilicon wires. Capacitors 114 and 116 can be applied externally to add to the distributed capacitance of the long polysilicon wires. The size of the RC circuit may vary.

When clock signal Clk is low, latch 102 samples the value of the enable signal. When the clock is high, latch 102 is off and the value of the enable signal is held. The latched enable is held constant after the clock signal Clk goes high.

Figure 4:
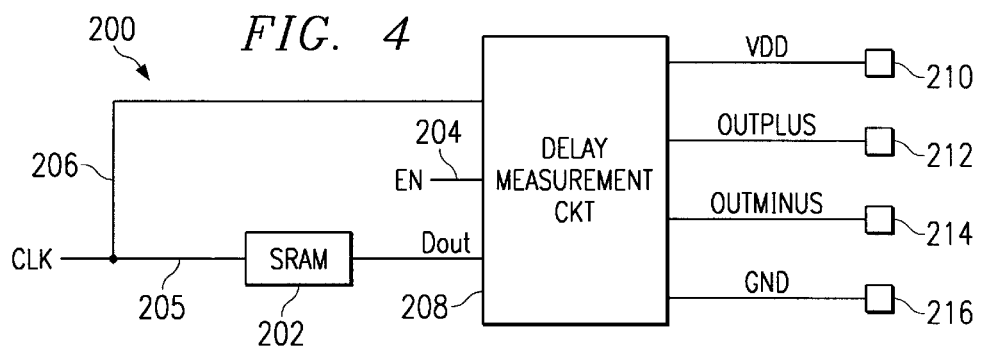
FIG. 4 is a SRAM access time measuring apparatus in accordance with the present invention.

FIG. 4 illustrates an embodiment 200 for measuring the access time of an SRAM 202. A clock signal Clk is applied to the input of the SRAM 202. At the same time the clock signal Clk is applied to input 206 of the delay measurement circuit 208 of FIG. 3. An enable signal is applied to the input 204 of the delay measurement circuit 208. The output of SRAM 202 is applied to the third input 205 of delay measurement circuit 208. Access time measurement circuit 200 has outputs 210, 212, 214 and 216.

In operation, SRAM 202 accepts an input Clk, and starts its read operation on the rising edge of Clk. SRAM 202 has a first input clock, read and write inputs. SRAM 202 has two outputs, $D_{out}$ and $D_{outx}$, where SRAM 202 outputs a pulse on the line $D_{OUT}$ to indicate the presence of data. In many cases, SRAM 202 may output a dual-rail output, $D_{out}$ and $D_{outx}$. If data on the first input is a one, output $D_{out}$ will rise. Conversely, if the data is a zero, then output $D_{outx}$ will rise. The access time is the difference in time between the rising edge of Clk and the rising edge of output $D_{out}$.

In cases where SRAM 202 has an access time that is longer than a clock cycle, it is best to turning off the enable every other clock cycle such that the clock signal Clk is only on every other clock cycle. This makes the phase detector 108 appear to be running at half the frequency. Thus, every other output is the reciprocal of the input data signal Clk. FIG. 2 assumes that $Clk_1$ comes before $Clk_2$, or equivalently in the circuit of FIG. 4, that input Clk comes before output $D_{out}$.

In order to properly initialize the state of the phase detector 108, it is desirable to be able to turn off either of the two inputs to the phase detector 108. The input Clk input can be turned off by setting the enable input EN to zero, so that input signal Clk is blocked by the NAND gate 104. NAND gate 106 can be disabled with a separate signal. In the alternative, SRAM 202 can perform a write operation which does not produce any output signal $D_{out}$.

For access times larger than the clock cycle, the access time can be measured by blocking every other pulse at the Clk and $D_{out}$ inputs. Therefore, the enable input EN can be toggled to block the Clk input and SRAM 202 can toggle between read and write operations to eliminate the pulse $D_{out}$ on alternate cycles.

Figure 5:
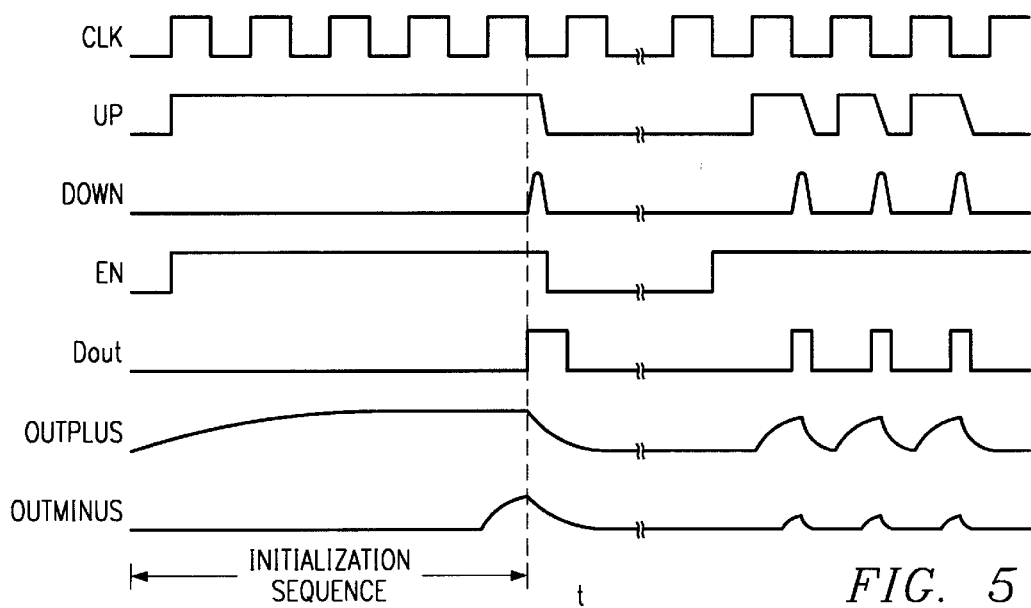
FIG. 5 is a timing diagram with respect to the built-in circuit delay time measuring apparatus of FIG. 3.

Operation of circuit 100 can be best understood by reference to FIG. 5 which displays a timing diagram for the embodiment shown in FIGS. 3 and 4. Accordingly, a pulse at the output UP is on for the interval between the rising edge of the signal Clk and the falling edge of the enable signal EN. The output DOWN produces a short pulse. The duration of the pulse UP is actually slightly longer than the time interval between the arrival of the inputs Clk and EN, so that the difference in durations between the outputs UP and DOWN is equal to the interval between the arrival of Clk and EN. The rising edge of clock signal Clk initiates the rising edge of the signal UP. The rising edge of signal $D_{out}$ initiates the rising edge of the signal DOWN. The falling edge of the signal DOWN initiates the falling edges of signals UP and DOWN. The enable signal initiates at the first rising edge of clock signal Clk. Thus, the combination of the rising edge of the enable signal and the rising edge of the clock signal Clk initiates the rising edge of the signal UP. In the case where the enable signal is on, the clock signal is running and the rising edge of signal $D_{out}$ has not occurred, signal UP remains high. At this point, the rising edge of signal $D_{out}$ initiates the rising edge of signal DOWN. Accordingly, the falling edge of signal DOWN initiates the falling edge of both signals UP and DOWN. In the case where time elapses as shown and the enable signal is off, all signals are low. Once enable is turned on at the rising edge of the clock signal Clk, the signal UP rises at the next rising edge of the clock signal Clk. Accordingly, signal $D_{out}$ rises. The rising edge of signal $D_{out}$ initiates the rising edge of signal DOWN. The falling edge of signal DOWN initiates the falling edge of both signals UP and DOWN. This is repeated for three cycles. As shown, output signals Outplus and Outminus are RC filtered versions of signals, UP and DOWN.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A circuit for measuring access time for a memory device, having an input and output and a power supply rail, $V_{DD}$, comprising:
   a clocking signal, having a period, T, the input of the memory device coupled to receive the clocking signal;
   a phase detector having a first and a second input and a first and a second output, the first input coupled to the input of the memory device, the second input coupled to the output of the memory device;
   a first filter coupled to the first output of the phase detector;
   a second filter coupled to the second ouput of the phase detector;
   a comparator for measuring the difference, $V_{Diff}$, between the first filtered output signal and the second filtered output signal;
   a processing unit coupled to the comparator to calculate the access time, where access time=$(V_{Diff}/V_{DD})$ T.

2. A circuit for measuring access time of a memory device as recited in claim 1, wherein the first filter is a low pass filter.

3. A circuit for measuring access time of a memory device as recited in claim 2, wherein the first low pass filter, having an input and an output, includes a resistor and a capacitor, the resistor coupled between the input and the output of the first low pass filter, the capacitor coupled between the output of the first low pass filter and ground.

4. A circuit for measuring access time of a memory device as recited in claim 1, wherein the second filter is a low pass filter.

5. A circuit for measuring access time of a memory device as recited in claim 4, wherein the second low pass filter, having an input and an output, includes a resistor and a capacitor, the resistor coupled between the input and the output of the first low pass filter, the capacitor coupled between the output of the first low pass filter and ground.

6. A circuit for measuring access time of a memory device as recited in claim 1, further comprising:
   an enable signal for intitializing the test measurement;
   a latch having a data input, a clocking input and an output, wherein the clocking signal is applied to the data input and the enable signal is applied to the clocking input;
   a first NAND gate having first and second input and an output, the first input coupled to the clocking signal and the second input coupled to the output of the latch;
   a second NAND gate having first and second input and an output, the first input coupled to the output of the memory device and the second input coupled to ground;
   the first input of the phase detector coupled to the first output of the first NAND gate and the second input of the phase detector coupled to the output of the second NAND gate.

7. A circuit for measuring access time of a memory device as recited in claim 1, wherein said phase detector includes:
   a third NAND gate having first and second input and an output, said first input coupled to the output of said first NAND gate;
   a fourth NAND gate having first and second input and an output, said first input coupled to the output of said third NAND gate;
   a fifth NAND gate having first and second input and an output, said first input coupled to the output of said fourth NAND gate;
   a sixth NAND gate having first and second input and an output, said first input coupled to the second input of said fifth NAND gate;
   a seventh NAND gate having first and second input and an output, said first input coupled to the output of said sixth NAND gate;
   a eighth NAND gate having first and second input and an output, said first input coupled to the output of said second NAND gate;
   a ninth NAND gate having a first, second and third input and an output, said first input coupled to the output of said third NAND gate, said third input coupled to the output of said fourth NAND gate;
   a tenth NAND gate having a first, second, third, and fourth input and an output, said first input coupled to the output of said sixth NAND gate, said second input coupled to the output of said fourth NAND gate, said third input coupled to the output of said third NAND gate, said fourth input coupled to the output of said eighth NAND gate, said output couples to the second input of said fourth, fifth, sixth, and ninth NAND gate;
   a eleventh NAND gate having a first, second, and third input and an output, said first input coupled to the output of said eighth NAND gate, said second input coupled to the output of said seventh NAND gate, said third input coupled to the output of said tenth NAND gate, said output coupled to the second input of said eighth NAND gate;

a first inverter having an input and an output, the input coupled to the output of said ninth NAND gate;

a second inverter having an input and an output, the input coupled to the output of said first inverter;

a third inverter having an input and an output, the input coupled to the output of said second inverter;

a fourth inverter having an input and an output, the input coupled to the output of said eleventh NAND gate;

a fifth inverter having an input and an output, the input coupled to the output of said fourth inverter; and a sixth inverter having an input and an output, the input coupled to the output of said fifth inverter.

8. A method for measuring access time in a memory device having an input and output and a power supply rail, $V_{DD}$, comprising the steps of:

applying a clocking signal, having a period, T, to the input of the memory device;

applying the clocking signal to a first input of a phase detector having a first and a second input and a first and a second output;

applying the output of the memory device to the second input of the phase detector;

filtering the first and second outputs of the phase detector;

calculating the difference, $V_{Diff}$ between the first and second filtered output signal of the phase detector;

calculating the access time of the memory device, where the access time=$(V_{Diff}/V_{DD})$ T.

* * * * *